US006795723B1

(12) United States Patent
Liu

(10) Patent No.: US 6,795,723 B1
(45) Date of Patent: Sep. 21, 2004

(54) INTERLEAVED PHASE ENCODING ACQUISITION FOR MRI WITH CONTROLLABLE ARTIFACT SUPPRESSION AND FLEXIBLE IMAGING PARAMETER SELECTION

(75) Inventor: Kecheng Liu, Solon, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 475 days.

(21) Appl. No.: 09/862,243

(22) Filed: May 22, 2001

Related U.S. Application Data

(60) Provisional application No. 60/206,451, filed on May 22, 2000.

(51) Int. Cl.⁷ .............................. A61B 5/05; G01V 3/00
(52) U.S. Cl. ...................................... 600/410; 324/307
(58) Field of Search ................. 600/407–436; 324/306–309

(56) References Cited

U.S. PATENT DOCUMENTS

| | | | | |
|---|---|---|---|---|
| 4,516,582 A | * | 5/1985 | Redington | 600/419 |
| 4,581,581 A | * | 4/1986 | Pelc | 324/309 |
| 4,970,457 A | * | 11/1990 | Kaufman et al. | 324/309 |
| 5,051,697 A | * | 9/1991 | Pattany et al. | 324/306 |
| 5,167,232 A | | 12/1992 | Parker et al. | |
| 5,537,039 A | * | 7/1996 | Le Roux et al. | 324/309 |
| 6,023,635 A | | 2/2000 | Liu et al. | |
| 6,037,771 A | | 3/2000 | Liu et al. | |
| 6,043,654 A | | 3/2000 | Liu et al. | |
| 6,201,986 B1 | * | 3/2001 | Riederer et al. | 600/419 |
| 6,373,249 B1 | * | 4/2002 | Kwok et al. | 324/306 |
| 6,385,478 B1 | * | 5/2002 | Hajnal | 600/410 |
| 6,492,811 B1 | * | 12/2002 | Foxall | 324/309 |
| 6,564,082 B2 | * | 5/2003 | Zhu | 600/410 |

OTHER PUBLICATIONS

K. Liu, et al., "Sliding Interleaved $k_y$(SLINKY) Acquisition: A Novel 3D TOF MRA Technique with Suppressed Slab Boundary Artifact," J. Magn Reson Imag 1998, vol. 8: pp. 905–911.

K. Liu, et al., "Reduced Slab Boundary Artifact in Multi–Slab 3D Fast Spin–Echo Imaging," MRM Aug., 2000, vol. 44: pp. 269–276.

J.A. Robert, et al., "Sliding Interleaved Projection Reconstruction Acquisition (SLIPR)" Proceedings of the ISMRM 7th Annual Meeting, Philadelphia, 1999, p. 159.

J.H. Brittain, et al., "SLINKY MRA with Time Variant Gradients and Flow–Independent Contrast", Proceedings of the ISMRM 7th Annual Meeting, Philadelphia, 1999, p. 1913.

K. Liu, "SLINKY: Understanding, Optimization and Application for High Resolution MRA", 7th Annual ISMRM, Pennsylvania, presented May 27, 1999.

* cited by examiner

*Primary Examiner*—Daniel Robinson
(74) *Attorney, Agent, or Firm*—Fay, Sharpe, Fagan, Minnich & McKee, LLP

(57) ABSTRACT

A method of a conducting a magnetic resonance imaging experiment with an interleaved phase encoding acquisition includes setting an interleave factor which is an imaging parameter that represents the number of interleaves in the interleaved phase encoding acquisition, and determining an artifact suppression factor. The artifact suppression factor is an imaging parameter that represents an amount of SBA suppression achieved in the imaging experiment being conducted. The method further includes determining if the artifact suppression factor falls within a range. When the artifact suppression factor falls outside the range, notification is provided, and when the artifact suppression factor falls inside the range, a sequence of progression is determined for an excitation slab employed in the imaging experiment.

17 Claims, 3 Drawing Sheets

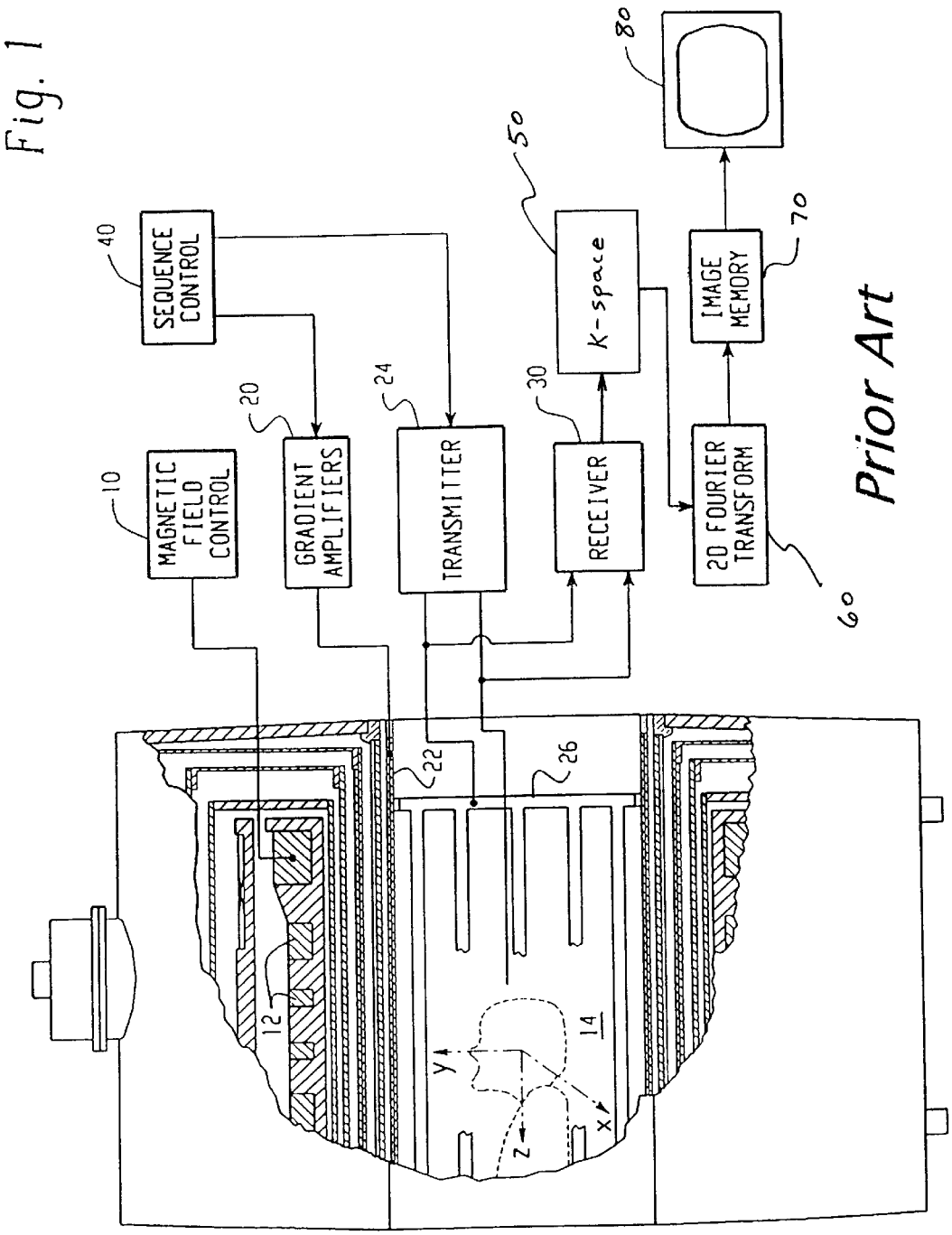

INTERLEAVED PHASE ENCODING ACQUISITION FOR MRI WITH CONTROLLABLE ARTIFACT SUPPRESSION AND FLEXIBLE IMAGING PARAMETER SELECTION

This application claims the benefit of U.S. Provisional Application No. 60/206,451, file May 22, 2000.

BACKGROUND OF THE INVENTION

The present invention relates to the art of diagnostic medical imaging. It finds particular application in conjunction with magnetic resonance imaging (MRI) scanners, and will be described with particular reference thereto. However, it is to be appreciated that the present invention is also amenable to other like applications.

Various known MRI techniques have been found useful in aiding medical diagnosis. Commonly, in MRI, a substantially uniform temporally constant main magnetic field, $B_0$, is set up in an examination region in which a subject being imaged or examined is placed. Nuclei in the subject have spins which in the presence of the main magnetic field produce a net magnetization. The nuclei of the spin system precess in the magnetic field at the Larmor frequency, i.e., the resonant frequency. Radio frequency (RF) magnetic fields at and/or near the resonant frequency are used to manipulate the net magnetization of the spin system.

Among other things, RF magnetic fields at the resonant frequency are used to, at least partially, tip the net magnetization from alignment with the main magnetic field into a plane transverse thereto. This is known as excitation, and the excited spins produce a magnetic field, at the resonant frequency, that is in turn observed by a receiver system. Shaped RF pulses applied in conjunction with gradient magnetic fields are used to manipulate magnetization in selected regions of the subject and produce a magnetic resonance (MR) signal. The resultant MR signal may be further manipulated through additional RF and/or gradient field manipulations to produce a series of echoes (i.e., an echo train) as the signal decays. The various echoes making up the MRI signal are typically encoded (i.e., phase encoded and frequency or read encoded) via magnetic gradients set up in the main magnetic field.

The raw data from the MRI scanner is collected into a matrix commonly known as k-space. Typically, each echo is sampled a plurality of times to generate a data line or row of data points in k-space. The echo or data line's position in k-space (i.e., its relative k-space row) is typically determined by its gradient encoding. Ultimately, in an imaging experiment, by employing Inverse Fourier or other known transformations, an image representation of the subject is reconstructed from the k-space data.

As opposed to two dimensional (2D) imaging techniques which excite a 2D cross-sectional slice with each excitation, three dimensional (3D) or volume imaging refers to the practice of exciting a 3D volume within the subject. The resulting MR signal(s) are then sampled into a 3D k-space matrix with each slice therein typically having a distinct phase encoding position. In general, techniques for 3D or volume imaging are well known in the art. For example, 3D imaging techniques have been found particularly useful in studying blood vessels and blood or fluid flow via what is known as 3D magnetic resonance angiography (MRA) and/or magnitude contrast or time-of-flight (TOF) techniques.

When 3D imaging methods are employed to produce an MRA image, the size of the excited volume becomes a limiting factor. For example, to maximize the diagnostic value of an MRA image, it is advantageous to have a large volume thickness and in turn a large field of view along a general direction of blood flow. However, TOF and/or MRA images decrease in quality as the volume thickness increases due to the saturation of the spins as they flow through the excited volume. That is, due to the increased thickness of the excited volume, blood remains in the volume for a longer time and becomes saturated by the selective RF excitation pulse. As a result, fresh blood entering the volume appears much brighter in the reconstructed image than blood which has remained in the volume for a number of excitations.

Accordingly, one approach that has been developed involves acquiring a series or set of contiguous thin 3D slabs and stacking them together to form the entire volume of interest. However, this can lead to what is known as the slab boundary artifact (SBA) which gives a "venetian blind" appearance to the resulting image. The SBA artifact is characterized by signal loss at the slab boundaries due to, e.g., imperfect slab excitation profiles, is flow dependent, and results in a signal intensity oscillation along the blood vessels. In turn, the artifact can result in, e.g., a false depiction of lumen diameter, over estimation of stenosis and/or atherosclerosis in clinical MRA images, etc.

One way to address the SBA problem is to overlap, to some degree, adjacent slabs. The acquisition technique is sometimes referred to as a multiple overlapping thin slab acquisition (MOTSA). An example of such a technique is found in U.S. Pat. No. 5,167,232 to Parker, et al., incorporated herein by reference in its entirety. The overlap method, however, has its own limitations. For example, it is accompanied by over sampling along the direction of the slab thickness or overlap, i.e., typically the z-axis. This over sampling results in inefficient data acquisition and can significantly increase the scan time relative to the amount of time it would have otherwise taken for the same overall volume of interest. Also, such oversampling only relieves the static SBA which is caused by, e.g., an imperfect RF pulse. It does not address dynamic SBA caused by flow conditions which are, at the very least, extremely difficult to predict.

In part to address the SBA and above problems, so called interleaved phase encoding acquisitions have been developed, such as the SLiding INterleaved $k_y$ (SLINKY) 3D acquisition technique and Shifted Interleaved Multi-Volume Acquisition (SIMVA or SIMUVA) for 3D fast spin echo (FSE). See for example, U.S. Pat. Nos. 6,037,771 and 6,043,654 to Liu, et al., both incorporated herein by reference in their entirety. These techniques have been found advantageous. However, the full extent of possible implementations for interleaved phase encoding acquisitions has not been completely appreciated in the prior art. That is to say, e.g., the artifact suppression factor, $k_{as}$, (described later herein) has been fix at 100% in certain implementations. As a result, the flexibility of imaging parameter selection as well as scan time efficiency has been undesirably limited. In this regard, the present invention represents a supplementary extension of and improvement over the techniques disclosed in the aforementioned patents.

In short, the present invention contemplates an improved interleaved phase encoding acquisition technique which builds upon the prior art techniques to provide for controllable artifact suppression and flexible MRI parameter selection and allow for an adjustable trade-off between SBA suppression and scan time efficiency.

BRIEF SUMMARY OF THE INVENTION

In accordance with one aspect of the present invention, a method of a conducting a magnetic resonance imaging experiment with an interleaved phase encoding acquisition is provided. The method includes setting an interleave factor which is an imaging parameter that represents the number of interleaves in the interleaved phase encoding acquisition, and determining an artifact suppression factor. The artifact suppression factor is an imaging parameter that represents an amount of SBA suppression achieved in the imaging experiment being conducted. The method further includes determining if the artifact suppression factor falls within a range. When the artifact suppression factor falls outside the range, notification is provided, and when the artifact suppression factor falls inside the range, a sequence of progression is determined for an excitation slab employed in the imaging experiment.

In accordance with another aspect of the present invention, a magnetic resonance scanner for conducting a magnetic resonance imaging experiment with an interleaved phase encoding acquisition includes setting means for setting an interleave factor which is an imaging parameter that represents the number of different interleaves in the interleaved phase encoding acquisition. Suppression determining means determine an artifact suppression factor which is an imaging parameter that represents an amount of SBA suppression achieved. Deciding means determine if the artifact suppression factor falls within a range. When the artifact suppression factor falls outside the range, notification means provide notification, and when the artifact suppression factor falls inside the range, sequence determining means determine a sequence of progression for an excitation slab generated by the scanner.

One advantage of the present invention is the adjustable suppression of slab boundary artifacts.

Another advantage of the present invention resides in the ability to have a flexible imaging parameter selection in connection with an interleaved phase encoding acquisition so as to achieve an adjustable compromise between SBA suppression and scan time efficiency which can be optimized as desired for a particular imaging experiment.

Still further advantages and benefits of the present invention will become apparent to those of ordinary skill in the art upon reading and understanding the following detailed description of the preferred embodiments.

BRIEF DESCRIPTION OF THE DRAWING(S)

The invention may take form in various components and arrangements of components, and in various steps and arrangements of steps. The drawings are only for purposes of illustrating preferred embodiments and are not to be construed as limiting the invention.

FIG. 1 is a diagrammatic illustration showing an MRI scanner for use in connection with aspects of the present invention.

DETAILED DESCRIPTION OF THE PREFERRED EMBODIMENT(S)

Figure 2A:
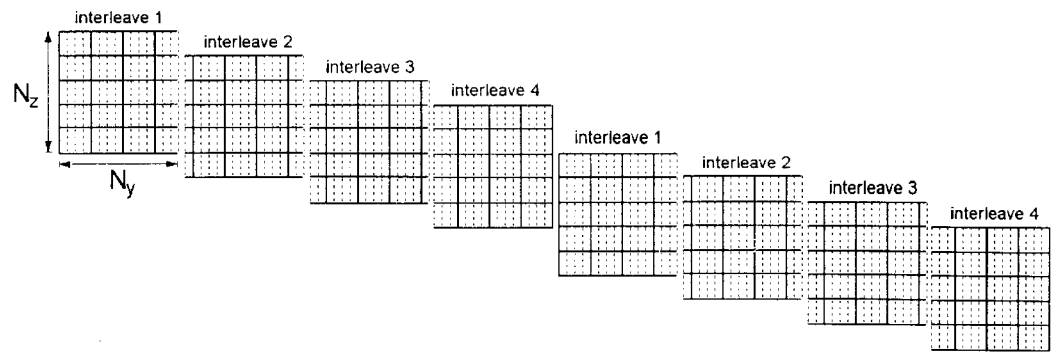
FIG. 2A is a diagrammatic illustration showing an exemplary data sampling of a k-space matrix for an interleaved phase encoding acquisition in accordance with aspects of the present invention.

With reference to FIG. 1, an MRI scanner A, as is known in the art, is employed to non-invasively acquire medical images or image representations of a region of interest of a subject positioned therein. While the MRI scanner A depicted in FIG. 1 is the central bore type, alternate types of MRI scanners (e.g., so called open-magnet scanners) are equally applicable to the present invention. In any event, the scanner A includes a main magnetic field control 10 that controls superconducting or resistive magnets 12 such that a substantially uniform, temporally constant main magnetic field, $B_0$, is created along a z-axis through an examination region 14. In a subject (e.g., patient, phantom, or otherwise) placed within the examination region 14, the magnetic field sets up a spin system having a net magnetization. An imaging experiment is conducted by executing a magnetic resonance sequence with the subject being imaged or examined placed at least partially within the examination region 14. The magnetic resonance sequence comprises a series of RF and magnetic field gradient pulses that are applied to the subject to invert or excite magnetic spins, induce magnetic resonance, refocus magnetic resonance, manipulate magnetic resonance, spatially and otherwise encode the magnetic resonance, to saturate spins, and the like. More specifically, gradient pulse amplifiers 20 apply current pulses to a gradient coil assembly 22 to set up magnetic field gradients in the main magnetic field along x, y and z-axes of the examination region 14. An RF transmitter 24, optionally digital, applies electrical RF pulses or pulse packets to an RF coil (optionally, a whole-body RF coil 26) to generate RF magnetic fields (at resonance) in the examination region. A typical RF pulse is composed of a packet of immediately contiguous pulse segments of short duration which taken together with each other and any applied gradients achieve a selected magnetic resonance manipulation.

The RF pulses are used to saturate, excite resonance, invert magnetization, refocus resonance, or manipulate resonance in selected portions of the examination region. For whole-body applications, the resulting resonance signals, generated as a result of a selected manipulation, are also commonly picked up by the whole-body RF coil 26. Alternately, for generating RF pulses in limited regions of the subject, local RF coils are commonly placed contiguous to or near the selected region. For example, as is known in the art, an insertable head coil (not shown) may be inserted surrounding a selected brain region at the isocenter of the bore, a selected surface coil (not shown) may be employed, a set of phased-array coils, or other such specialized RF coils may be employed. In addition to generating RF pulses, optionally, the local RF coil also receives magnetic resonance signals from the selected region. In still other embodiments or applications, the whole-body RF coil 26 generates the RF pulses while the local RF coil receives the resulting magnetic resonance signals or vice versa.

Regardless of the RF coil configuration, the resultant magnetic resonance signals are picked up by one or another of the RF coils employed and demodulated by a receiver 30, optionally a digital receiver. Preferably, a sequence control circuit or control processor 40 controls the gradient pulse amplifiers 20 and the RF transmitter 24 to produce an MRI pulse sequence that generates encoded MR signals or echoes which are received and sampled by the receiver 30 as raw MR data. The received MR data is loaded into a data storage device or memory 50 representing k-space. A reconstruction processor 60 applies inverse Fourier transformations and/or other known MRI reconstruction algorithms to the k-space data to generate image data representative of the subject in the examination region 14. The image data generated by the reconstruction processor 60 is preferably maintained in a data storage device or memory 70 from which it is selectively accessed and formatted into one or more image representations of the subject for depiction on a video monitor 80 or other human viewable display or image rendering device. The image optionally represents a planar slice or cross section through the subject, an array of parallel planar slices, a 3D volume, a surface rendering or the like. While not shown, depending on the pulse sequence employed, the usual k-space data corrections and/or processing is optionally carried out at an appropriate point along the data processing stream. For example, in the case of an FSE sequence, a phase correction may be optionally applied to properly align the data in k-space.

Figure 2B:
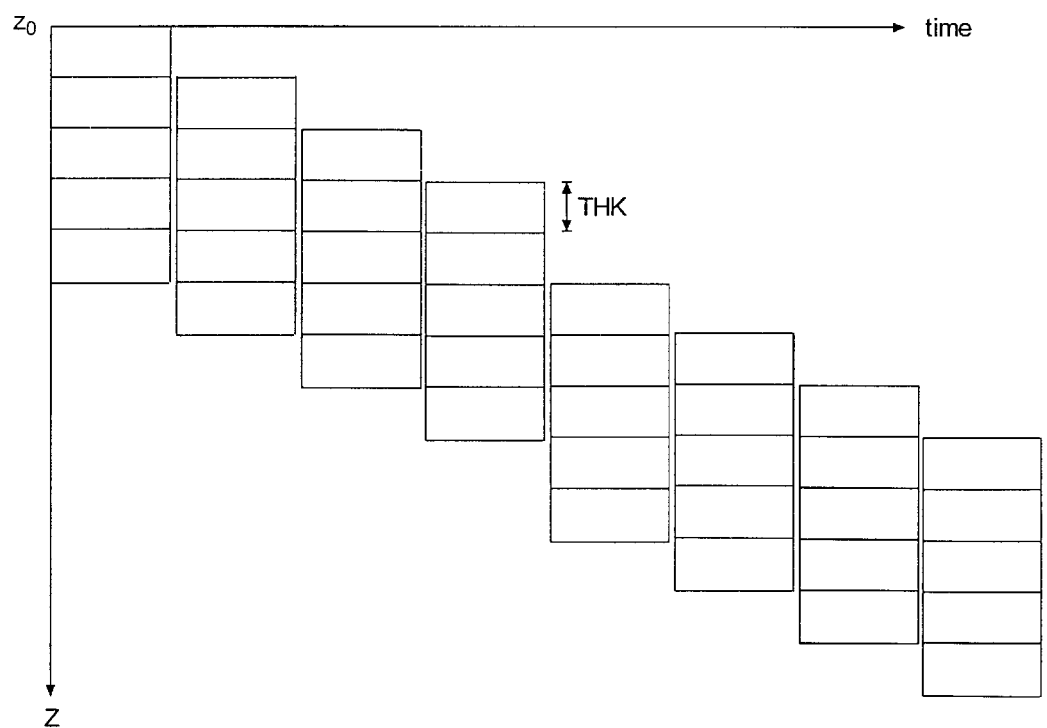
FIG. 2B is a graph showing with respect to time an exemplary progression of an excitation slab corresponding to the acquisition shown in FIG. 2A.

In a preferred embodiment, the sequence control 40 directs operation of the scanner A to produce an interleaved phase encoding acquisition such as, e.g., SLINKY, SIMVA or the like. For purposes of illustrating aspects of the present, FIGS. 2A and 2B are graphical representations showing an exemplary interleaved phase encoding acquisition in accordance with aspects of the present invention. More specifically, FIGS. 2A and 2B illustrate a SLINKY acquisition, however, it is to be appreciated that the present invention is equally applicable to alternate techniques, methods and/or devices employing any interleaved phase encoding acquisition.

Each identified interleave is depicted in FIG. 2A as a k-space matrix representing a thin 3D excitation slab at successive overlapping positions. FIG. 2B shows the progression of the excitation slab with time. As shown, the excitation slab is sliding across the subject in the z direction. While the interleaves are 3D dimensional in k-space, the $k_x$ direction or axis (i.e., the direction or axis of read or frequency encoding) is not shown. That is to say, the interleaves are shown in the z-y plane.

At each position or location of the slab along its progression, a selected or successive interleave of MR data is acquired and loaded into k-space in the usual manner. Each respective interleave includes a complete sampling of k-space in the $k_z$ phase encoding direction (i.e., the secondary phase encoding direction), and a partial sampling of k-space in the $k_y$ phase encoding direction (i.e., the primary phase encoding direction). In other words, each acquisition or interleave represents an image which is undersampled along the primary phase encoding direction. For each interleave, the unsampled $k_y$ phase encoding steps of the k-space matrix are represented by the broken vertical lines shown in FIG. 2A. The sampled $k_y$ phase encoding steps of the k-space matrix are represented by the solid vertical lines in each interleave shown in FIG. 2A.

Each particular interleave includes a corresponding partial $k_y$ acquisition, i.e., each interleave samples a unique subset of $k_y$ phase encoding steps, respectively. As is understood in the art with respect to an interleaved phase encoding acquisition, the $k_y$ phase encoding steps sampled within each interleave are not sequential, but rather, are distributed in a fashion such that when all the interleaves are combined the sampled $k_y$ phase encoding steps from the respective interleaves are interlaced and completely fill the k-space matrix in the $k_y$ phase encoding direction.

In accordance with the present notation, $N_z$ is an integer value which represents the total number of non-blanked or non-discarded slices per slab, i.e., the total number of useful slices per slab along the direction of slab progression. Due to imperfections in the RF excitation profile or the like, slices at an end of the slab may exhibit undesirable and/or inconsistent behavior or may have unwanted characteristics and are discarded or blanked so as to not contribute to the final image. $N_z$ does not include slices so treated. Accordingly, $N_z$ is typically less than the total number of $k_z$ encoding steps. THK in FIG. 2B represents the slice thickness.

$N_y$ is the total number of $k_y$ phase encoding steps in the k-space matrix. $N_{int}$ is the number of interleaves, also termed the interleaves factor. The relationship between the number of interleaves and the total number of $k_y$ phase encoding steps can be described mathematically by the following equation:

$$N_y = m * N_{int} \qquad (1),$$

where m is an integer value representing the number of $k_y$ phase encoding steps in each subset thereof sampled by the interleaves. Similarly, $N_y$ and $N_{int}$ are integer values.

For a given number of interleaves and a given number of slices in an interleaved phase encoding acquisition, an artifact suppression factor, $k_{as}$, is mathematically defined by the following expression:

$$k_{as} = \frac{N_{int}}{N_z}. \qquad (2)$$

The artifact suppression factor, $k_{as}$, is a measurement of or otherwise representative of the amount of SBA suppression achieved. In a typical implementation of an interleaved phase encoding acquisition, 100% suppression is desired and/or mandated. 100% suppression is only achieved when $k_{as}=1.0$, which in turn forces $N_{int}=N_z$. In this manner, the selection of imaging parameters is limited and inflexible.

However, this is not the case with the present invention. Rather, in the case of a preferred embodiment of the present invention, $N_{int}$ is held at a determined value while $N_z$ remains variable or selectable such that $k_{as}$ for any given scan may fall within a determined range. A preferred range is between 0.75 and 1.0, the lower limit of which has been chosen based upon empirical evidence and/or test results which indicate that, as compared to 100% SBA suppression, the observed image degradation resulting from SBA suppression as low as 75% is generally unnoticeable and/or clinically insignificant in many circumstances.

With respect to the example shown in FIGS. 2A and 2B, the flexibility of a preferred embodiment is illustrated. The example shown has $N_{int}=4$, m=4, $N_y=16$ and $N_z=5$. Accordingly, the relation of equation (1) is satisfied, i.e., $N_y=16=4*4=m*N_{int}$. Additionally, the artifact suppression factor $k_{as}$ as determined from equation (2) falls within the preferred range of 75% to 100% suppression. In particular, $k_{as}=0.80=4/5=N_{int}/N_z$. It is to be understood that these values are merely for illustrative purposes, and other values for the imaging parameters may be selected as desired for a particular imaging experiment provided equations (1) and (2) are satisfied.

Figure 3:
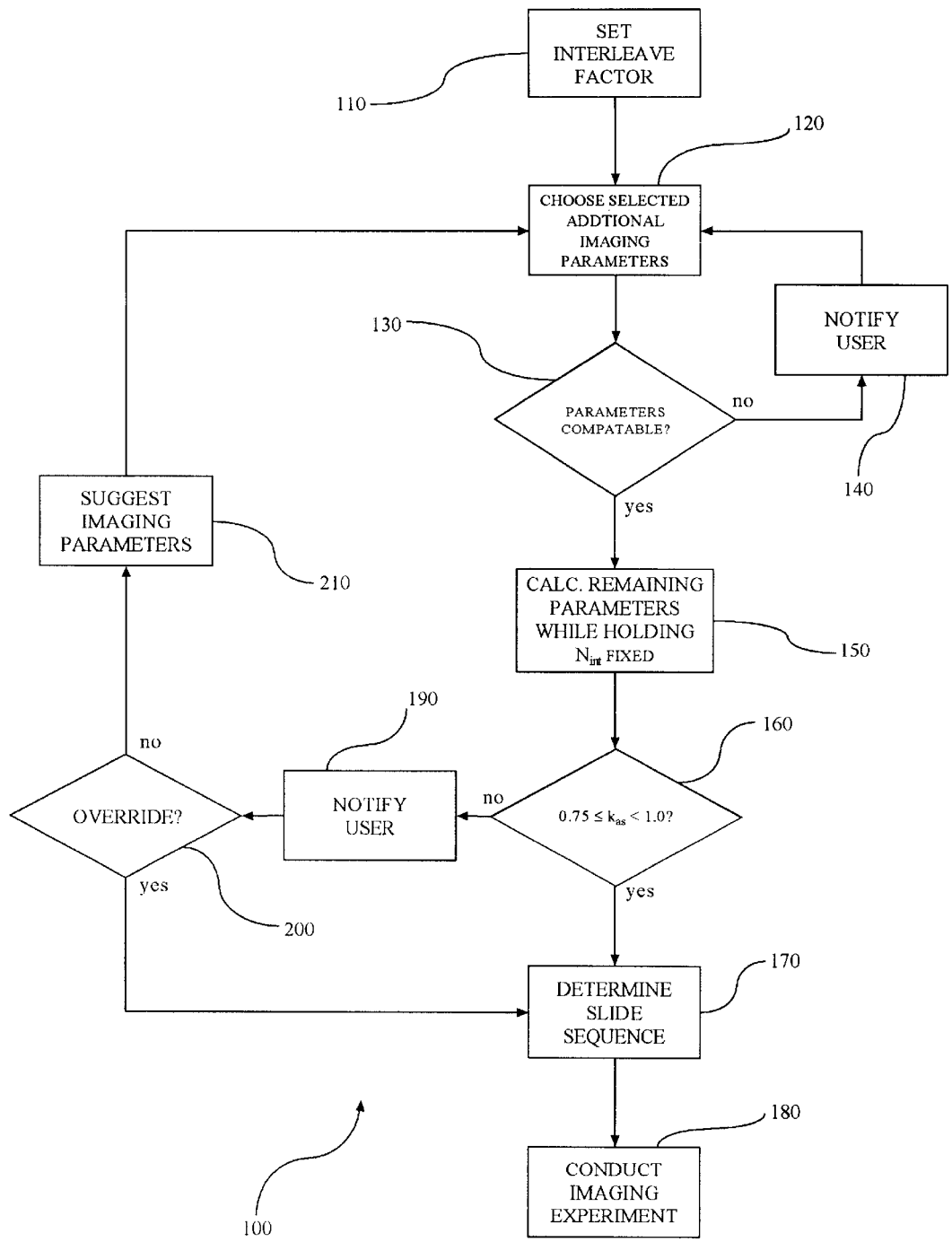
FIG. 3 is a flow chart showing a imaging parameter determination/selection process in accordance with aspects of the present invention.

With additional reference to FIG. 3, an exemplary parameter selection process 100 in accordance with aspect of the present invention is shown. Preferably, the process 100 is implemented via a user control terminal or workstation. The workstation is linked to the MRI scanner A and it allows a user to design and run imaging experiments thereon. The workstation preferably has pre-programmed thereon a number of imaging protocols including one or more sliding interleave protocols. In any event, the process 100 begins with step 110 wherein a selected or predetermined interleave factor, $N_{int}$, is set or fixed for the imaging experiment which is going to be conducted. In a preferred embodiment, $N_{int}$ is predetermined and fixed for the particular sliding interleave protocol being implemented. At step 120, a user is presented with the option of choosing the additional imaging parameters, e.g., $N_y$, $N_z$, m, $k_{as}$, etc. The user may specify values for all the parameters or merely selected parameters of particular interest to the user for the results desired. Optionally, the user may designate desired ranges in which the parameters are to fall.

At decision step 130, it is determined if the imaging parameters are compatible. If the determination is no or negative, the process 100 branches to step 140, otherwise, if the determination is yes or positive, the process 100 continues on to step 150. Parameter compatibility is determine by checking to see if equations (1) and (2) are satisfied. When, the values of the imaging parameters do not violate the equations, the parameters are deemed compatible. On the other hand, when the values of the imaging parameters do violate the equations, the parameters are deemed not compatible. Additionally, if an insufficient number of parameters have not had their values adequately defined, such that it cannot be determined whether or not the equations are violated, again, the parameters are deemed incompatible.

At step 140, the user is notified (preferably via the control terminal) that the selected parameter values are incompatible. Optionally, the specific incompatible parameters are identified in the notification. After the user is notified of the incompatibility, the process 100 loop back to step 120 so that he may re-select values for the additional imaging parameters.

On the other hand, at step 150, any unassigned parameter values are calculated in accordance with equations (1) and (2) while holding $N_{int}$ fixed. For example, where values for the additional imaging parameters $N_z$ and m are selected in step 120, the values of $k_{as}$ and $N_y$ are calculated in step 150. In another example, the values of $k_{as}$ and $N_y$ may be selected in step 120 and the values of $N_z$ and m may be calculated in step 150.

At decision step 160, it is determined if the value of $k_{as}$ falls within a preferred range, i.e., if $k_{as}$ is greater than or equal to 0.75 and less than 1.0. This range represents a preferred range of acceptable compromises between image quality and imaging time with the lower end of the range representing a relatively lower image quality but a relatively better imaging time and the upper end of the range representing a relatively poorer imaging time but a relatively higher image quality. In any event, if the determination of step 160 is negative or no, the process 100 branches to step 190, otherwise, if the determination is positive or yes, the process 100 continues on to step 170.

At step 190, the user is notified (preferably via the control terminal) that $k_{as}$ falls outside the preferred range. The notification preferably identifies the values of $k_{as}$. Next, the user is given an override option. That is to say, if the user wishes to process even though $k_{as}$ falls outside the preferred range, he may execute an override. When an override is executed, decision step 200 branches the process 100 to step 170, otherwise, when no override is executed decision step branches the process 100 to step 210.

At step 210, the user is provided with suggested imaging parameters that will achieve a $k_{as}$ value which falls within the preferred range for the set interleave factor. Preferably, the user is provided with a number of suitable $N_z$ values. Following step 210, the process 100 loops back to step 120.

At step 170, the slide sequence for the given imaging parameters is determined. That is to say, unlike a technique which mandates and/or has 100% SBA suppression, when $k_{as}$ is less than 1.0 the sliding or progression of the interleave slab is not uniform. For example, when $k_{as}=1.0$ (100% SBA suppression) the slab progression is uniform, i.e., between each successive interleave sampling the slab progresses a distance corresponding to the slice thickness, THK. On the contrary, when $k_{as}<1.0$ the slab progression is non-uniform, i.e., between each successive interleave sampling the slab does not always progress a distance corresponding THK. Rather, depending on the imaging parameters, selected progressions between interleave samplings correspond to some integer multiple of THK. For example, given the imaging parameters of the SLINKY experiment shown FIG. 2B, the sliding sequence is as follows: for every slide, the slab progresses by a distance equal to THK each time, with the exception being that for every $4^{th}$ slide the slab progresses by a distance equal to 2*THK. In a preferred embodiment, the slide sequence is determined such that for every slide, the slab progression, SP, equals THK, with the exception being that for every $(N_{int})^{th}$ slide, $SP=THK+THK(N_z-N_{int})$. Different slide sequences are contemplated in alternate embodiments, however, each advancement of the slab is some integer multiple of THK and the total distance progressed between two consecutive samplings of the same interleave is equal to $N_z*THK$. In any event, once the imaging parameters and slide sequence have been established as described herein, at step 180 the imaging experiment is conducted in the otherwise usual manner for an interleaved phase encoding acquisition.

The invention has been described with reference to the preferred embodiments. Obviously, modifications and alterations will occur to others upon reading and understanding the preceding detailed description. For example, the invention is equally applicable to any interleaved phase encoding acquisition regardless of the trajectory in which k-space is filled. Without limitation, the invention herein may be implemented in conjunction with a Cartesian k-space trajectory, a spiral trajectory, or any other well known trajectory. In any event, it is intended that the invention be construed as including all such modifications and alterations insofar as they come within the scope of the appended claims or the equivalents thereof.

Having thus described the preferred embodiment(s), the invention is now claimed to be:

1. A method of a conducting a magnetic resonance imaging experiment with an interleaved phase encoding acquisition, said method comprising:
    (a) setting an interleave factor, wherein the interleave factor is an imaging parameter that represents the number of interleaves in the interleaved phase encoding acquisition;
    (b) determining an artifact suppression factor, said artifact suppression factor being an imaging parameter that represents an amount of SBA suppression achieved in the imaging experiment being conducted;
    (c) determining if the artifact suppression factor falls within a range;
    (d) providing notification when the artifact suppression factor falls outside the range; and,
    (e) determining a sequence of progression for an excitation slab employed in the imaging experiment when the artifact suppression factor falls inside the range.

2. A method of a conducting a magnetic resonance imaging experiment with an interleaved phase encoding acquisition, said method comprising:
    (a) setting an interleave factor, wherein the interleave factor is an imaging parameter that represents the number of interleaves in the interleaved phase encoding acquisition;
    (b) determining an artifact suppression factor, said artifact suppression factor being an imaging parameter that represents an amount of SBA suppression achieved in the imaging experiment being conducted, wherein the artifact suppression factor, $k_{as}$, is given by the following equation:

$$k_{as} = N_{int}/N_z \quad (2),$$

where $N_{int}$ is the interleave factor and $N_z$ represents the number of slices in the excitation slab along the excitation slab's direction of progression;
    (c) determining if the artifact suppression factor falls within a range;
    (d) providing notification when the artifact suppression factor falls outside the range; and,
    (e) determining a sequence of progression for an excitation slab employed in the imaging experiment when the artifact suppression factor falls inside the range.

3. The method according to claim 2, wherein the artifact suppression factor is selected by a user and the number of slices in the excitation slab along the excitation slab's direction of progression is determined based thereon in accordance with equation (2).

4. The method according to claim 2, wherein the number of slices in the excitation slab along the excitation slab's direction of progression is selected by a user and the artifact suppression factor is determined based thereon in accordance with equation (2).

5. The method according to claim 2, wherein the range is between 0.75 inclusive and 1.0.

6. The method according to claim 2, wherein the excitation slab progresses is a series of advancements of irregular distances.

7. The method according to claim 6, wherein each advancement is by a distance which corresponds to an integer multiple of THK, where THK is an imaging parameter representing slice thickness in the direction of the excitation slab's progression.

8. The method according to claim 7, wherein each advancement in the series thereof is by a distance equal to THK except for those advancements in the series that correspond to integer multiples of $N_{int}$ which advancements are by a distance equal to THK+THK ($N_z-N_{int}$).

9. A magnetic resonance scanner for conducting a magnetic resonance imaging experiment with an interleaved phase encoding acquisition, said scanner comprising:
    setting means for setting an interleave factor, said interleave factor being an imaging parameter that represents the number of different interleaves in the interleaved phase encoding acquisition;
    suppression determining means for determining an artifact suppression factor, said artifact suppression factor being an imaging parameter that represents an amount of SBA suppression achieved;
    deciding means for determining if the artifact suppression factor falls within a range;
    notification means for providing notification when the artifact suppression factor falls outside the range; and,
    sequence determining means for determining a sequence of progression for an excitation slab generated by the scanner when the artifact suppression factor falls inside the range.

10. A magnetic resonance for conducting a magnetic resonance imaging experiment with an interleaved phase encoding acquisition, said scanner comprising:
    setting means for setting an interleave factor, said interleave factor being an imaging parameter that represents the number of different interleaves in the interleaved phase encoding acquisition;
    suppression determining means for determining an artifact suppression factor, said artifact suppression factor being an imaging parameter that represents an amount of SBA suppression achieved, wherein the artifact suppression factor, $k_{as}$, is given by the following equation:

$$k_{as} = N_{int}/N_z \quad (2),$$

where $N_{int}$ is the interleave factor and $N_z$ represents the number of slices in the excitation slab along the excitation slab's direction of progression;
    deciding means for determining if the artifact suppression factor falls within a range;

notification means for providing notification when the artifact suppression factor falls outside the range; and, sequence determining means for determining a sequence of progression for an excitation slab generated by the scanner when the artifact suppression factor falls inside the range.

11. The scanner of claim 10, wherein the suppression determining means determines the artifact suppression factor based on imaging parameters selectively input by a user such that when a value for the artifact suppression factor is input by the user that value is determined to be the artifact suppression factor otherwise when a user inputs a value for the number of slices in the excitation slab along the excitation slab's direction of progress, the suppression determination means calculates the artifact suppression factor based thereon in accordance with equation (2).

12. The scanner of claim 11, further comprising:

calculating means which determine the number of slices in the excitation slab along a direction of the excitation slab's progression in accordance with equation (2) based upon an input value for the artifact suppression factor.

13. The scanner of claim 10, wherein the sequence of progression of the excitation slab includes a series of advancements of irregular distances.

14. The scanner of claim 13, wherein each advancement is by a distance which corresponds to an integer multiple of THK, where THK is an imaging parameter representing slice thickness in the direction of the excitation slab's progression.

15. The scanner of claim 14, wherein each advancement in the series thereof is by a distance equal to THK except for those advancements in the series that correspond to integer multiples of $N_{int}$ which advancements are by a distance equal to THK+THK ($N_z-N_{int}$).

16. The scanner of claim 10, wherein the range is between 0.75 inclusive and 1.0.

17. A magnetic resonance scanner for conducting a magnetic resonance imaging experiment with an interleaved phase encoding acquisition, said scanner comprising:

a processor that:

sets an interleave factor, wherein the interleave factor is an imaging parameter that represents the number of interleaves in the interleaved phase encoding acquisition;

determines an artifact suppression factor, said artifact suppression factor being an imaging parameter that represents an amount of SBA suppression achieved in the imaging experiment being conducted;

determines if the artifact suppression factor falls within a range;

provides notification when the artifact suppression factor falls outside the range; and, determines a sequence of progression for an excitation slab employed in the imaging experiment when the artifact suppression factor falls inside the range.

* * * * *